United States Patent
Narayanan et al.

(10) Patent No.: US 10,642,601 B2
(45) Date of Patent: May 5, 2020

(54) APPARATUS AND METHODS FOR IN-APPLICATION PROGRAMMING OF FLASH-BASED PROGRAMMABLE LOGIC DEVICES

(71) Applicant: Microsemi SoC Corporation, San Jose, CA (US)

(72) Inventors: Venkatesh Narayanan, Fremont, CA (US); Kenneth R. Irving, Austin, TX (US); Ming-Hoe Kiu, Belmont, CA (US)

(73) Assignee: Microsemi SoC Corporation, Chandler, AZ (US)

( * ) Notice: Subject to any disclaimer, the term of this patent is extended or adjusted under 35 U.S.C. 154(b) by 159 days.

(21) Appl. No.: 15/432,659

(22) Filed: Feb. 14, 2017

(65) Prior Publication Data

US 2017/0161224 A1 Jun. 8, 2017

Related U.S. Application Data

(62) Division of application No. 13/037,058, filed on Feb. 28, 2011, now Pat. No. 9,582,266.

(51) Int. Cl.

| | |
|---|---|
| *G06F 8/654* | (2018.01) |
| *G06F 15/78* | (2006.01) |
| *G06F 13/10* | (2006.01) |
| *G06F 13/24* | (2006.01) |
| *G06F 13/40* | (2006.01) |
| *G11C 16/10* | (2006.01) |

(52) U.S. Cl.
CPC ............ *G06F 8/654* (2018.02); *G06F 13/102* (2013.01); *G06F 13/24* (2013.01); *G06F 13/4068* (2013.01); *G06F 15/7871* (2013.01); *G06F 15/7882* (2013.01); *G11C 16/10* (2013.01)

(58) Field of Classification Search
None
See application file for complete search history.

(56) References Cited

U.S. PATENT DOCUMENTS

| | | | |
|---|---|---|---|
| 5,768,598 | A | 6/1998 | Marisetty et al. |
| 5,838,165 | A | 11/1998 | Chatter |
| 6,704,850 | B1 | 3/2004 | Reynolds |
| 7,170,315 | B2 | 1/2007 | Bakker et al. |

(Continued)

OTHER PUBLICATIONS

FlashFlex Microcontroller In-Application Programming Basics, Aug. 2008, pp. 1-4.

(Continued)

*Primary Examiner* — George Giroux
(74) *Attorney, Agent, or Firm* — Glass and Associates; Kenneth Glass; Kenneth D'Alessandro

(57) ABSTRACT

An architecture disposed in an integrated circuit for in-application programming of flash-based programmable logic devices includes a processor coupled to a processor system bus. An I/O peripheral is coupled to the processor over the system bus and is also coupled to an off-chip data source. A programmable logic device fabric includes flash-based programmable devices. A program controller is coupled to the flash-based programmable devices. An in-application programming controller is coupled to the program controller and is coupled to the processor over the system bus.

10 Claims, 2 Drawing Sheets

(56) References Cited

U.S. PATENT DOCUMENTS

| | | | |
|---|---|---|---|
| 7,548,181 B1 * | 6/2009 | Bausov | G01S 13/32 342/129 |
| 7,616,508 B1 * | 11/2009 | Landry | H03K 19/17768 365/189.15 |
| 7,683,660 B1 | 3/2010 | Bakker et al. | |
| 7,949,818 B2 | 5/2011 | Suyama | |
| 8,380,911 B2 | 2/2013 | Daftardar | |
| 2004/0017724 A1 * | 1/2004 | Kubota | G06F 15/7867 365/222 |
| 2006/0277346 A1 * | 12/2006 | Doak | G06F 13/387 710/305 |
| 2006/0294290 A1 * | 12/2006 | Raker | G06F 8/656 711/100 |
| 2008/0052700 A1 * | 2/2008 | Han | G06F 8/65 717/168 |
| 2008/0185903 A1 * | 8/2008 | Bausov | E21C 27/24 299/1.2 |
| 2009/0058462 A1 | 3/2009 | Mason et al. | |
| 2009/0113196 A1 * | 4/2009 | Jan | G06F 8/654 713/2 |
| 2009/0251867 A1 * | 10/2009 | Sharma | H04Q 1/08 361/737 |
| 2010/0153679 A1 * | 6/2010 | Abdul | G06F 9/5011 711/173 |
| 2010/0259296 A1 * | 10/2010 | Or-Bach | H03K 19/17736 326/38 |
| 2010/0289064 A1 * | 11/2010 | Or-Bach | H01L 21/26506 257/209 |
| 2010/0291749 A1 * | 11/2010 | Or-Bach | G11C 17/14 438/401 |
| 2012/0167100 A1 * | 6/2012 | Li | G11C 16/102 718/102 |

OTHER PUBLICATIONS

Wikipedia, "Direct Memory Access" article, May 26, 2009, 6 pages.

* cited by examiner

APPARATUS AND METHODS FOR IN-APPLICATION PROGRAMMING OF FLASH-BASED PROGRAMMABLE LOGIC DEVICES

CROSS REFERENCE TO RELATED APPLICATIONS

This application is a divisional of U.S. patent application Ser. No. 13/037,058 filed Feb. 28, 2011, the contents of which are incorporated in this disclosure by reference in its entirety.

BACKGROUND

1. Field of the Invention

The present invention relates to integrated circuits and in particular to programmable logic devices such as field-programmable gate array (FPGA) integrated circuits. More concisely, the present invention relates to apparatus and methods for in-application programming of flash-based programmable logic devices.

2. The Prior Art

There is no known method for a flash-based programmable logic device to program or reconfigure by itself. An external device or an application is always required to program the Flash based programmable logic device.

BRIEF DESCRIPTION

According to a first aspect of the present invention, an architecture disposed in an integrated circuit for in-application programming of flash-based programmable logic devices includes a processor coupled to a processor system bus. An I/O peripheral is coupled to the processor over the system bus and is also coupled to an off-chip data source. A programmable logic device fabric includes flash-based programmable devices. A program controller is coupled to the flash-based programmable devices. An in-application programming controller is coupled to the program controller and is coupled to the processor over the system bus.

According to another aspect of the present invention, a method employing a hardwired on-chip processor and an on-chip programming controller to perform in-application programming of non-volatile memory in a programmable logic integrated circuit comprises providing an in-application programming controller on the integrated circuit communicating with the processor and the programming controller. In response to a request to program nonvolatile memory on the integrated circuit a programming operation is initiated in the in-application programming controller that includes providing programming data by the processor to the in-application programming controller, and running a programming algorithm in the in-application programming controller to controlling programming of the nonvolatile memory by the programming controller.

BRIEF DESCRIPTION OF THE DRAWING FIGURES

DETAILED DESCRIPTION

Persons of ordinary skill in the art will realize that the following description of the present invention is illustrative only and not in any way limiting. Other embodiments of the invention will readily suggest themselves to such skilled persons.

The present invention makes it possible to use an on-chip processor to program the non-volatile targets such as embedded NVM, Flash ROM and programmable logic fabric within a programmable logic device while the processor sub-system is still functioning.

Figure 1:
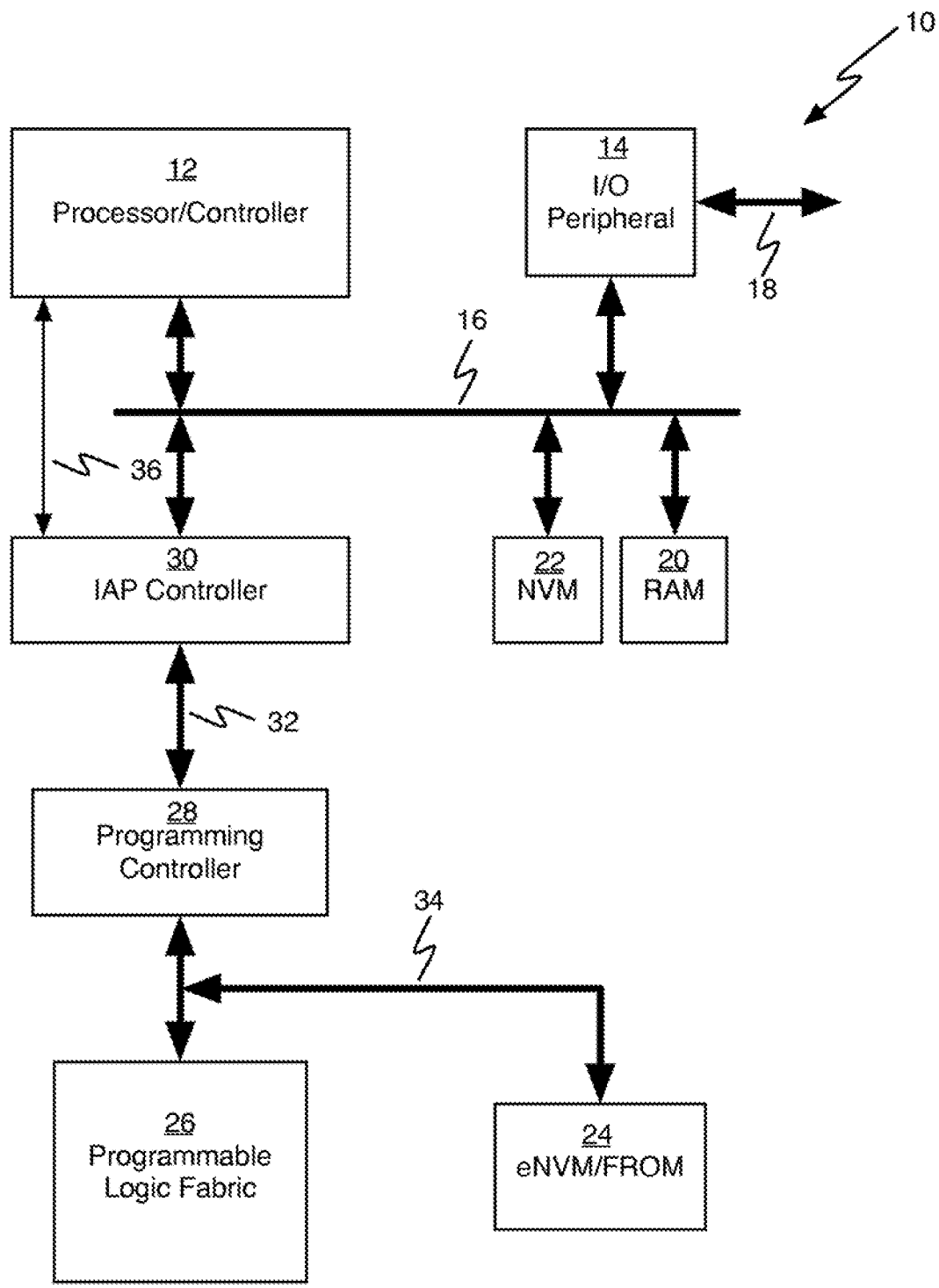
FIG. 1 is a block diagram of illustrative circuitry for in-application programming of flash-based programmable logic devices according to the present invention.

Referring first to FIG. 1, a block diagram shows an illustrative subsystem 10 for in-application programming of flash-based programmable logic devices according to the present invention. Subsystem 10 includes an embedded microprocessor or other controller 12. The embedded microprocessor or other controller 12 communicates with at least one peripheral 14, such as SPI, I2C, UART or Ethernet MAC over a system bus 16. An I/O bus 18 couples the peripheral 14 to off-chip data sources. The embedded microprocessor or other controller 12 is hardwired into the integrated circuit rather than created by programming the function into the integrated circuit. The embedded microcontroller subsystem also includes a memory subsystem including both embedded SRAM 20 and embedded eNVM 22.

The embedded microprocessor or other controller 12 is used to perform processing functions associated with the programmable logic device as is known in the art. According to the present invention, the embedded microprocessor or other controller 12 is also programmed to program the non-volatile targets such as embedded NVM 24, Flash ROM and programmable logic fabric 26 within a programmable logic device while the processor sub-system continues to function performing other tasks.

An in-application programming feature according to the present invention is unique by architecture designed to program itself by the embedded microprocessor 12 while it is functioning or performing its normal operations such as communicating with external devices through its peripherals 14.

The embedded microcontroller/processor 12 in the flash based programmable device executes a program to drive the programming controller 28 normally found in a programmable logic device by interacting through the IAP (In Application Programming) controller block 30. By employing the IAP controller block 30 to direct the programming controller 28 over bus 32, the microcontroller/processor 12 offloads the processing tasks to the IAP controller block 30 and thus retains sufficient bandwidth to enable it to continue performing other tasks while the flash devices are being programmed.

IAP controller block 30 is one of the peripherals connected to the microcontroller subsystem through the system bus 16. IAP controller block 30 can be formed as a state machine designed to interface with the programming controller 28 and also implement the low level JTAG signaling functionality to offload the processor 12 so that the processor 12 can still be performing its normal functions.

The on chip processor 12 manages the data bit stream communication from the source to the IAP controller 30. The on-chip processor 12 transfers a data bit stream through any of the hard communication peripherals 14 that are part of the microcontroller subsystem in chunks of bits required to program a single row or segment of non-volatile memory in the memory block 24 or the programmable logic fabric 26. The processor 12 shifts in the bit stream in chunks of certain size into IAP controller 30 and commands the IAP controller 30 through the programming algorithm.

The memory block 24 and the programmable logic array fabric 26 can be programmed one row at a time or a segment at a time. Processor 12 has back pressure built in as is known in the art to control the data flow through the communication peripheral 14 from the data bit stream source presented on I/O bus 18 in order to avoid any additional memory requirement to store the programming bit stream. Persons of ordinary skill in the art will appreciate that the size of the data chunk depends on the architecture of the non-volatile memory being programmed. This is buffered in the processor memory.

Upon request for the IAP controller 30 to program the fabric/FROM/eNVM from any of the designated communication peripheral 14, the processor 12 will check the JTAG status of the programming controller 28. This is indicated by a bit in a register within the IAP controller 30 to state whether or not the programming controller 28 is in a reset state.

If the programming controller 28 is in a reset state, the processor 12 can start the programming sequence by enabling the IAP controller 30. If the programming controller 28 is not in reset, the processor 12 will hold off until it is in a reset state. This scenario is only possible when the programming controller 28 is in use through an external JTAG interface.

The processor 12 executes the programming algorithm (erase, program and verify) controlling the JTAG state machine in the IAP controller 30. The programming operation is performed one row or segment at a time over bus 34 between the programming controller 28 and the FPGA fabric 26 or the memory block 24. When programming a row or segment is done, IAP controller 30 sends an interrupt to the processor 12 over interrupt line 36 to cause processor 12 to fetch programming data for the next row or segment until the entire fabric is programmed. FROM and eNVM 24 are programmed in similar fashion. The interrupt may be set based on the state of an interrupt bit in a status register in the IAP controller 30 state machine. This bit is set by IAP controller 30 upon completion of any programming operation. Alternatively, a status register in the IAP controller 30 may provide a status bit to the controller to indicate readiness to accept a new command or a new row or segment of programming data. The processor upon interrupt initiates the next instruction/command based on the programming algorithm. It is the responsibility of the processor to clear the interrupt source upon servicing an interrupt request. This task requires very little bandwidth from the processor.

In some embodiments of the present invention, the communication interface between the IAP Controller 30 and the processor 12 may be through a JTAG architecture present in the integrated circuit. A JTAG command may be used to communicate the interrupt to the processor 12. Control of this interface is multiplexed between the external JTAG pins on the integrated circuit and a corresponding JTAG interface on the IAP Controller 30. The IAP controller 30 is thus taking higher level commands from the processor bus and translating them into low level JTAG operations. Instructions and data from the processor bus are serialized by the IAP controller 30 to send into the JTAG interface of the Programming Controller 28 and output data from the Programming Controller 28 is deserialized and sent back onto the processor bus.

In an illustrative embodiment where a JTAG interface is employed between the processor 12 and the IAP controller 30, a programming operation on the device can consist of a sequence built from 4 basic JTAG operations:

1. GOTO STATE
2. LOAD INSTRUCTION
3. LOAD/READ DATA
4. WAIT

The IAP controller 30 defines each of these four primitive operations as a high level command. When a command is received from the processor 12, the IAP controller 30 generates the appropriate activity on the JTAG interface, generating the required number of TCK cycles for sequencing the JTAG Programming Controller through the required state transitions and serializing/de-serializing the instructions & data.

An illustrative algorithm required to program the device could be configured as follows:

GOTO STATE "RESET"
GOTO STATE "IDLE"
LOAD INSTRUCTION "PROGRAMMING_MODE"
GOTO STATE "RUN"
WAIT
LOAD INSTRUCTION "ERASE"
GOTO STATE "RUN"
WAIT
LOAD INSTRUCTION "SELECT ROW ADDRESS"
LOAD DATE "1"
LOAD INSTRUCTION "SET DATA"
LOAD DATA "WORD 0"
LOAD DATA "WORD 1"
. . .
LOAD DATA "WORD N"
LOAD INSTRUCTION "PROGRAM"
GOTO STATE RUN
WAIT
LOAD INSTRUCTION "SELECT ROW ADDRESS"
LOAD DATA "2"
. . .

The processor runs through this algorithm by writing each command in turn to the IAP controller. While the IAP controller is busy processing the current command (generating the appropriate JTAG activity) the processor is free to do other tasks.

In other embodiments of the invention, the IAP controller includes a parallel interface to both the processor 12 on the system bus 16 and the programming controller 28 on bus 32. In such embodiments, the IAP controller 30 may be thought of as being a part of the programming controller 28. As previously noted, its function is to perform the processing required for programming so that the processor 12 can perform other tasks while programming is being performed. Such embodiments including a parallel interface such as a FIFO replacing the IAP Controller 30 to the processor 12 are faster than the slow serial JTAG interface.

Programming error conditions are read out of registers in the programming controller 28 and are dealt with as a part of the programming algorithm as is well known in the art.

Figure 2:
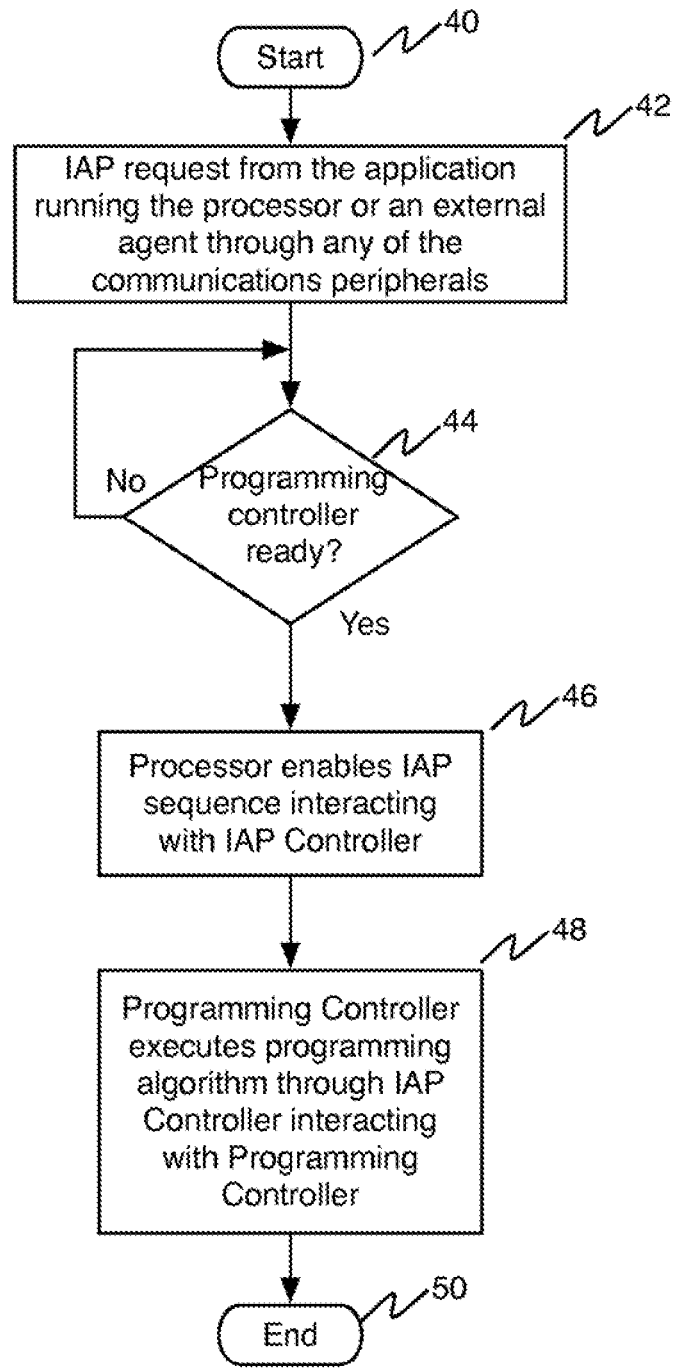
FIG. 2 is a flow diagram of an illustrative method for in-application programming of flash-based programmable logic devices according to the present invention.

Referring now to FIG. 2, a flow diagram shows an illustrative method for in-application programming of flash-based programmable logic devices according to the present invention. First, the [process begins at reference numeral 40. At reference numeral 42, an IAP request is received from the application running the processor or from an external agent through any of the communications peripherals. At reference numeral 44, it is determined whether the programming controller 28 is ready to accept data and perform its function. This process loops until the programming controller is ready.

At reference numeral 46, the Processor 12 enables an IAP sequence by interacting with IAP Controller 30. At reference numeral 48, the Programming Controller 28 executes the programming algorithm through IAP Controller 30 interacting with Programming Controller 28. As noted, this process is usually performed either on a row basis or a segment basis, with processor 12 only needing to service interrupts to provide more row or segment data to the IAP controller 30. This leaves processor 12 free to perform other tasks while programming is taking place. Finally, at reference numeral 50, the process ends after all memory locations to be programmed have been programmed and verified.

During the programming process, the processor may need to assure that the I/O circuits of the integrated circuit are placed in a known state. This may be especially necessary where the programmable logic fabric 26 is being re-programmed, in order to avoid causing unintended state changes or operations in the system of which the programmable integrated circuit is a part.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. An architecture disposed in an integrated circuit for in-application programming of flash-based programmable logic devices comprising:

a processor in the integrated circuit and coupled to a processor system bus;

an I/O peripheral in the integrated circuit and coupled to the processor over the system bus and coupled to an off-chip data source;

a programmable logic array fabric in the integrated circuit and including flash-based programmable devices;

a programming controller in the integrated circuit configured to program the flash-based programmable devices; and an in-application programming controller in the integrated circuit and coupled to the processor, the in-application programming controller separate from the programming controller and configured to control the operation of the programming controller in response to commands from the processor;

wherein the processor is configured to perform other tasks while the in-application programming controller executes the commands.

2. The architecture of claim 1 wherein the in-application programming controller is coupled to the processor over the system bus.

3. The architecture of claim 1 wherein the in-application programming controller is coupled to the processor over a JTAG interface.

4. The architecture of claim 1 wherein the in-application programming controller is configured as a state machine.

5. The architecture of claim 1 wherein the in-application programming controller is configured as a FIFO coupled between the system bus and the programming controller.

6. The architecture of claim 1 wherein the in-application programming controller communicates an interrupt to the processor.

7. The architecture of claim 1 wherein the programming controller is coupled to non-volatile memory elements associated with the programmable logic array fabric in the integrated circuit.

8. The architecture of claim 1 wherein the programming controller is coupled to non-volatile memory elements associated with user memory in the integrated circuit.

9. The architecture of claim 1 wherein the in-application program controller is configured to program nonvolatile memory by rows.

10. The architecture of claim 1 wherein the in-application program controller is configured to program nonvolatile memory by segments.

\* \* \* \* \*